United States Patent [19]

Uesugi et al.

[11] Patent Number: 4,873,413
[45] Date of Patent: Oct. 10, 1989

[54] METHOD AND APPARATUS FOR WRITING A LINE ON A PATTERNED SUBSTRATE

[75] Inventors: Fumihiko Uesugi; Yukio Morishige, both of Tokyo, Japan

[73] Assignee: NEC Corporation, Tokyo, Japan

[21] Appl. No.: 123,460

[22] Filed: Nov. 20, 1987

[30] Foreign Application Priority Data

Nov. 20, 1986 [JP] Japan ................................ 61-275234
Nov. 25, 1986 [JP] Japan ................................ 61-280995

[51] Int. Cl.[4] ............................................. B23K 26/00
[52] U.S. Cl. .......................... 219/121.68; 219/121.76; 219/121.84; 346/762; 427/53.1
[58] Field of Search ........... 219/121.6, 121.85, 121.84, 219/121.82, 121.8, 121.76; 346/76 L, 110 R; 427/53.1

[56] References Cited

U.S. PATENT DOCUMENTS

| | | | |
|---|---|---|---|
| 4,569,855 | 2/1986 | Matsuda et al. | 427/53.1 X |
| 4,595,601 | 6/1986 | Horioka et al. | 427/53.1 |
| 4,608,117 | 8/1986 | Ehrlich et al. | 427/53.1 X |
| 4,668,304 | 5/1987 | Schachameyer et al. | 427/53.1 X |
| 4,685,976 | 8/1987 | Schachameyer et al. | 427/53.1 X |
| 4,778,693 | 10/1988 | Drozdowicz et al. | 427/53.1 |

OTHER PUBLICATIONS

D. J. Ehrlich et al., "Laser Microchemical Techniques for Reversible Restruting of Gate-Array Prototype Circuits", IEEE Electron Device Letters, vol. EDL-5, No. 2, pp. 32-35, Feb. 1984.

D. J. Ehrlich et al., "Laser Microreaction for Deposition of Doped Silicon Films", Appl. Phys. Lett. 39(12), Dec. 1981, pp. 957-959.

Primary Examiner—C. L. Albritton
Attorney, Agent, or Firm—Sughrue, Mion, Zinn, Macpeak & Seas

[57] ABSTRACT

Method and apparatus for writing a line on a patterned substrate in which a direct writing of a CVD line is performed on at least two of patterned films on a substrate in accordance with the thermal decomposition of a CVD raw material gas which is resulted from the radiation of a laser beam. The laser beam is controlled in its power dependent on the difference between thermal conductivities of the at least two of patterned films to avoid a disconnection of the CVD line, the occurrence of thinner portion thereof and so on.

5 Claims, 7 Drawing Sheets

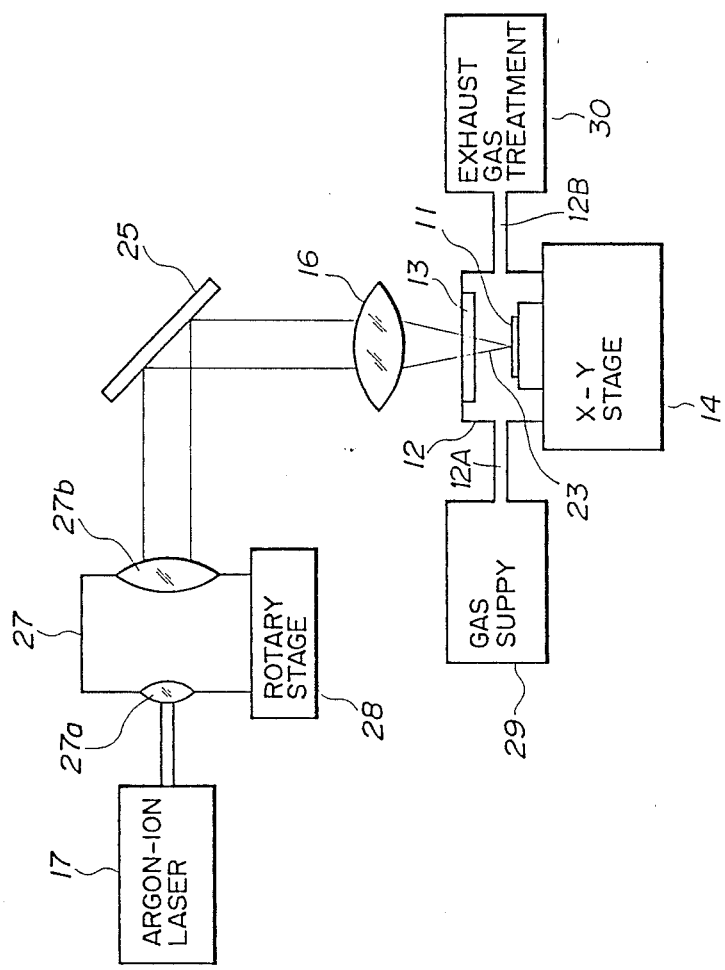

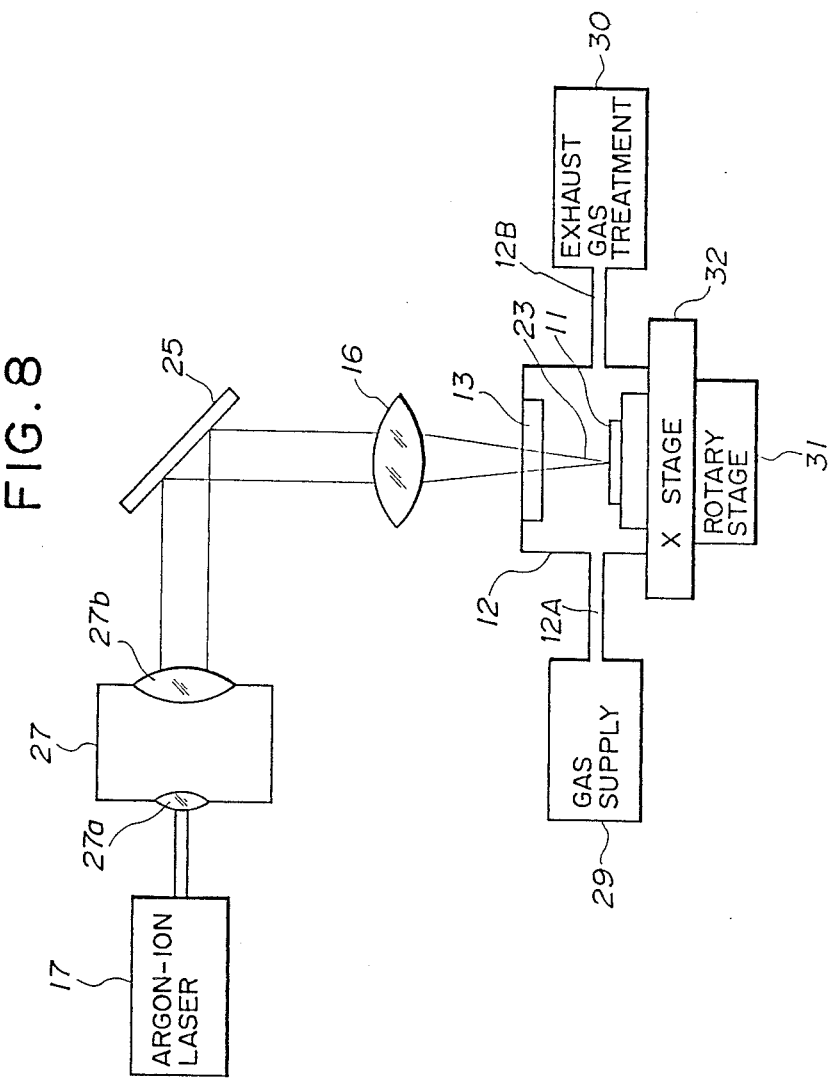

METHOD AND APPARATUS FOR WRITING A LINE ON A PATTERNED SUBSTRATE

FIELD OF THE INVENTION

The invention relates to method and apparatus for writing a line on a patterned substrate, and more particularly to method and apparatus for writing a line on a patterned substrate in which a thin film is deposited on a substrate having a surface which is patterned by different materials.

BACKGROUND OF THE INVENTION

One of conventional apparatus for writing a line on a patterned substrate comprises a laser light source for radiating a laser beam, a CVD (Chemical Vapor Deposition) cell having a window through which the laser beam is passed, an inlet through which vapor of CVD raw material gas is supplied, and an outlet to which an exhaust gas treatment unit is connected, and an X-Y stage on which the CVD cell is provided.

In operation, a substrate having a surface which is patterned by different materials is positioned, and the CVD raw material gas is supplied through the inlet into the CVD cell. At the same time, the laser light source is driven to radiate the laser beam which is focussed to pass through the window of the CVD cell so that the substrate is subject to the radiation of the laser beam therein. In the CVD cell, the CVD raw material gas is thermally decomposed due to a reaction at the interface of the gas and substrate so that a predetermined pattern of a line is deposited with the decomposed gas on the substrate in accordance with the scanning of the laser beam thereon.

The above mentioned operation is described, for instance, on pages 957 to 959 of "Appl. Phys. Lett. 39(12), Dec. 15, 1981" and on page 32 to 35 of "IEEE ELECTRON DEVICE LETTERS, VOL. EDL-5, NO. 2, February 1984".

In the former, a Si wafer from which a thermal oxidation film of $SiO_2$ is partially removed is positioned in a gas atmosphere of $SiH_4$, while Ar-ion laser beam scans the Si wafer to be heated up to a predetermined temperature. As a result, the $SiH_4$ gas is thermally decomposed so that a direct writing of Si can be performed on the Si wafer.

In the latter, a CMOS chip is subject to the radiation of Ar-ion laser beam to be formed with boron-doped poly-Si thereon so that a contact can be formed between the boron-doped poly-Si and Al wiring, thereby modifying an erroneous wiring in the CMOS chip.

According to the conventional apparatus for writing a line on a patterned substrate, however, there are resulted following disadvantages.

First of all, it is difficult to write a well defined thick line on a substrate in an expected high speed operation. This is why a radiation pattern of a laser beam is of a circular beam having Gaussian intensity distribution so that the scanning speed must be very high to shift the radiation position on the substrate prior to the occurrence of the thermal spread so as to provide a narrow width of a line thereon. Due to the high speed scanning of the laser beam, a thick line having a low wiring resistance can not be obtained.

Secondly, there is liable to be resulted an undesirable thinner line on the substrate when the scanning speed of a laser beam is increased without varying a power of the laser beam. In order to avoid the phenomenon, if the scanning speed of a laser beam is increased simultaneously with the increase of a radiation power of the laser beam, the center portion of a line is damaged due to an excessive thermal energy, and a line is transversely spread so that a width thereof is larger than a specified line because a region in which a raw material gas is thermally decomposed is transversely enlarged. In order to allow the increase of the scanning speed of a laser beam, further, it is considered that a supply amount of the raw material gas must be increased. In such a case, a film quality of a line is deteriorated to result in the increase of the resistivity thereof. For these reasons, it is difficult to write a line on a substrate in a high speed without decreasing characteristics of a film quality, thickness, and width thereof.

Thirdly, there is resulted a disconnection of a line or thinner line when the writing of a line is performed on a step portion of the substrate in a case where a minimum step moving distance of a scanning stage is nearly equal to a spot size of a laser beam so that an area on which the laser beams are overlapped in accordance with the moving of the stage is small. To avoid the disadvantage, a stage which has such a very fine minimum moving distance as sub-micron meter much smaller than a spot size of a laser beam must be adopted therein. Actually, however, it is not practical to utilize such a stage therein because the stage becomes very expensive, and the surrounding in which an apparatus for writing a line on a substrate including the stage is installed must be cared to maintain the performance thereof.

Fourthly, it is difficult to form a contact connecting a Si line to Al wiring because the thermal conductivity of Al is larger than that of such insulator films as $SiO_2$, SiN etc. by one figure. In more detail, even if the Al wiring is subject to the radiation of Ar-ion laser beam, the Al wiring is not heated up to a predetermined temperature by which a CVD of Si can be performed so that a good quality of Si-deposition is not obtained.

Finally, a disadvantage similar to the fourth disadvantage mentioned above is observed in a contact of Si line for connecting Al wiring on the upper and lower surfaces of an insulator film or passivation film through a via hole provided thereinto which is indispensable to the formation of wiring for a multilayered LSI. In such a use, there is observed a further disadvantage that it is difficult to form the burying of Si into the via hole so as to be in contact with the Al wiring at the bottom thereof due to the bad coverage of Si lines which are written on the side wall of the via hole because it is difficult that the side wall of the via hole is directly heated up to a predetermined temperature by a laser beam.

Such disadvantages that an uniform width of a direct-write line is difficult to be obtained on a substrate having different thermal conductivities by a laser CVD, that a good quality contact with Al wiring is difficult to be obtained, and that a deposition material is difficult to be buried into a via hole with a predetermined characteristic so that a good quality of a contact with Al wiring at the bottom of the via hole is difficult to be formed are occured not only in Si as mentioned before, but also in a case where one of CVDs of Mo, W, and W respectively induced from $Mo(CO)_6$, $W(CO)_6$, and $WF_6$ is utilized.

SUMMARY OF THE INVENTION

Accordingly, it is an object of the invention to provide method and apparatus for writing a line on a patterned substrate in which a well defined thick line is written directly on a patterned substrate with a high speed.

It is another object of the invention to provide method and apparatus for writing a line on a patterned substrate in which a predetermined thickness of a line is written directly on a patterned substrate.

It is a further object of the invention to provide method and apparatus for writing a line on a patterned substrate in which a disconnection of a line or thinner line is avoided to be written even if a minimum step moving distance of a scanning stage is nearly equal to a spot size of laser beam.

It is a still further object of the invention to provide method and apparatus for writing a line on a patterned substrate in which a stable contact connecting a line of a selected material to Al wiring is obtained even if the thermal conductivity of Al is much larger than that of the selected material.

It is a yet further object of the invention to provide method and apparatus for writing a line on a patterned substrate in which a good quality of a contact between Al wirings on the upper and lower surfaces is obtained.

According to one aspect of the invention, a method for writing a line on a patterned substrate comprises steps of, applying a laser beam to a substrate positioned in an atomosphere of a CVD raw material gas, said substrate having a plurality of patterned films thereon, and scanning said substrate by said laser beam to form a line of a thin film on at least two of said plurality of patterned films in a predetermined scanning direction, wherein a condition under which said laser beam is applied to said substrate is controlled dependent on the difference between thermal conductivities of said at least two of said plurality of patterned films.

According to another aspect of the invention, an apparatus for writing a line on a patterned substrate comprises, a laser beam source for radiating a laser beam, a CVD cell in which a substrate is positioned passed, said substrate having a plurality of patterned films thereon, an optical means for introducing said laser beam to said CVD cell, a gas supply means for supplying a CVD raw material gas into said CVD cell, means for setting a condition under which said laser beam is applied to said substrate so that a line is written on at least two of said plurality of patterned films due to the thermal decomposition of said CVD raw material, and a stage means on which said CVD cell is provided to be moved in the scanning direction so that said substrate in said CVD cell is scanned through said window by said laser beam, wherein said means for setting a condition is controlled to change said condition dependent upon the difference between thermal conductivities of said at least two of said plurality of patterned films.

BRIEF DESCRIPTION OF THE DRAWING

The invention will be explained in more detail in conjunction with the attached drawings wherein, FIG. 7 is a block diagram showing an apparatus for writing a line on a patterned substrate in a third embodiment according to the invention, and FIG. 8 is a block diagram showing an apparatus for writing a line on a patterned substrate in a fourth embodiment according to the invention.

DESCRIPTION OF THE PREFERRED EMBODIMENTS

Before describing an apparatus for writing a line on a patterned substrate in preferred embodiments according to the invention, a conventional apparatus for writing a line a patterned substrate as described before will be explained in more detail.

Figure 1:
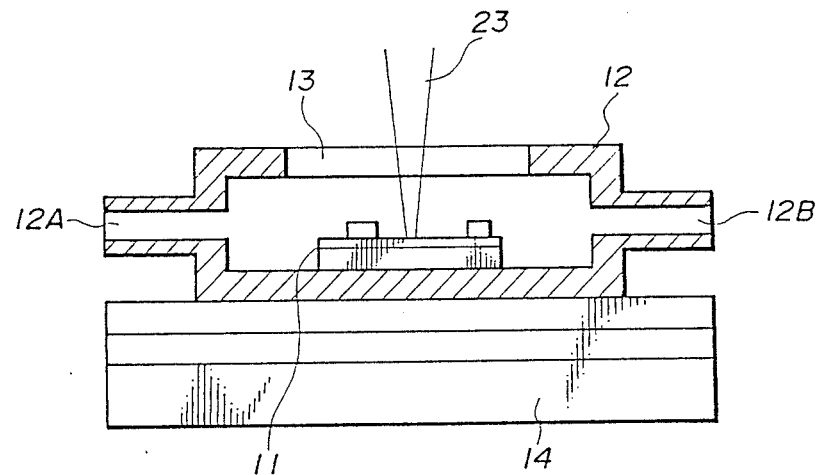
FIG. 1 is a cross sectional view showing a conventional apparatus for writing a line on a patterned substrate.

In FIG. 1, there is shown the conventional apparatus for writing a line on a patterned substrate which comprises a laser light source (not shown) for radiating a laser beam, a CVD (Chemical Vapor Deposition) cell 12 having a window 13 through which the laser beam 23 is passed, an inlet 12A through which vapor of CVD raw material gas is supplied, and an outlet 12B to which an exhausted gas treatment unit is connected, and an X-Y stage 14 on which the CVD cell 12 is provided.

In operation, a substrate 11 having a surface which is patterned by different materials is positioned, and the CVD raw material gas is supplied through the inlet 12A into the CVD cell 12. At the same time, the laser light source is driven to radiate the laser beam 23 which is focussed to pass through the window 13 of the CVD cell 12 so that the substrate 11 is subject to the radiation of the laser beam 23 therein. In the CVD cell 12, the CVD raw material gas is thermally decomposed due to a reaction at the interface of the gas and substrate 11 so that a predetermined pattern of a line is deposited with the decomposed gas on the substrate 11 in accordance with the scanning of the laser beam 23 thereon. The longitudinal scanning of the laser beam is performed in accordance with the X-directional moving of the substrate 11 on the X-Y stage, while the transverse scanning of the laser beam 23 is performed in accordance with the Y-directional moving of the substrate 11 on the X-Y stage.

Figure 2:
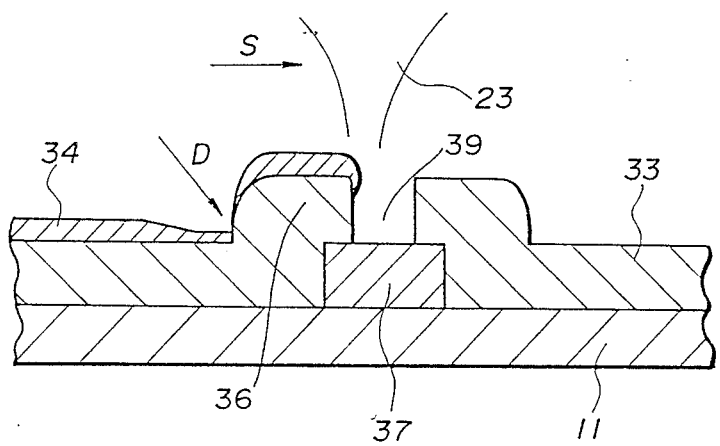
FIG. 2 is a cross sectional view showing a step portion of a patterned substrate on which a line is written by a conventional apparatus for writing a line on a patterned substrate.

In FIG. 2, there is shown a substrate 11 on which Al wiring 37 and an insulator film 33 having an opening aperture 39 are formed. As the substrate 11 moves towards the left direction on the X-Y stage 14, the substrate 11 is scanned in the right direction as shown by an arrow S by the laser beam 23 so that a line 34 is written on the insulator film 33 through a CVD process in accordance with gas decomposed by the radiation of the laser beam 23. In the process, however, a thickness of the line 34 is gradually decreased, as the scanning region approaches the Al wiring 37. Further, the line 34 is disconnected on the side wall of a step portion 36 of the insulator film 33 as shown by an arrow D. The reasons why such phenomenons are occured are explained before.

Figure 3:
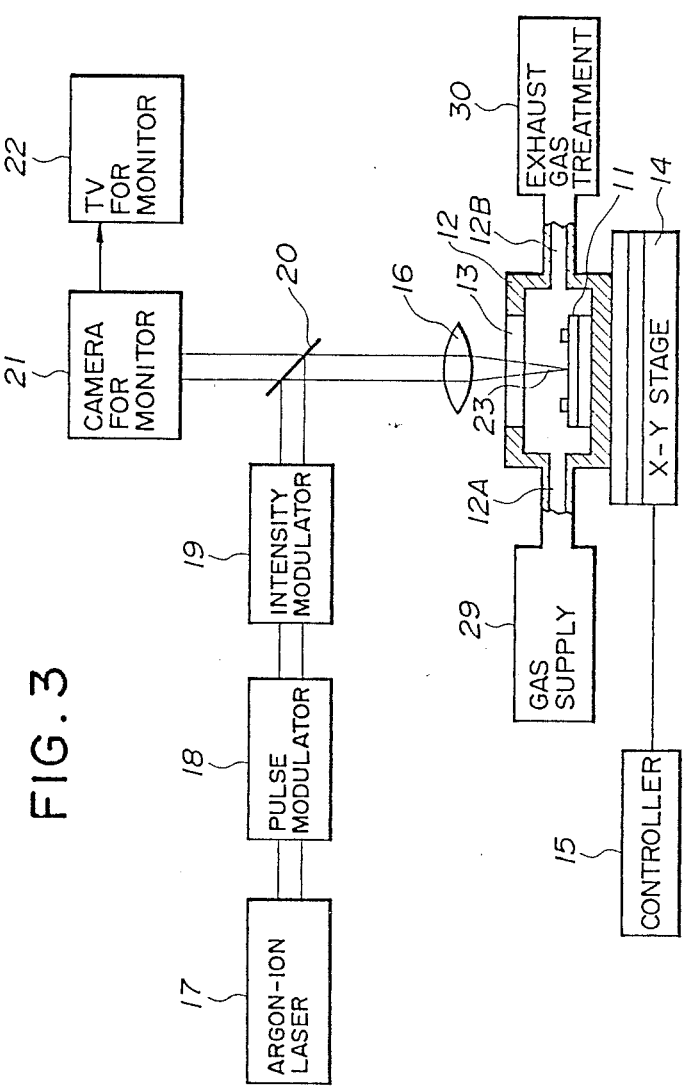
FIG. 3 is a block diagram showing an apparatus for writing a line on a patterned substrate in a first embodiment according to the invention.

Next, there will be explained an apparatus for writing a line on a patterned substrate in a first embodiment according to the invention. FIG. 3 shows the apparatus for writing a line on a patterned substrate which comprises a CVD cell 12 having a window 13 through which a laser beam 23 is passed, an inlet 12A through which vapor of $Mo(CO)_6$ is supplied from a gas supply source 29, and an outlet 12B to which an exhausted gas treatment unit 30 is connected, an X-Y stage 14 on which the CVD cell 12 is provided, a controller 15 for controlling the X-Y stage 14 to move in two directions orthogonal to each other, an Ar-ion laser means 17 for radiating a laser beam, a pulse modulator 18 for pulse-modulating the laser beam, an intensity modulator 19 for intensity-modulating the laser beam, a dichroic mirror 20 by which the laser beam is reflected and through which a predetermined wavelength of light is passed, a lens 16 for focussing the laser beam to be a predetermined spot size on a substrate 11 positioned in the CVD cell 12, a camera 21 for the monitor of the substrate 11 by receiving light which is passed through the dichroic mirror 20, and a television 22 for displaying the substrate 11 on which a line is written in accordance with the deposition of Mo.

Operation 1 (intensity modulation)

It is assumed that a Si substrate 11 which is covered with a $SiO_2$ film in accordance with the thermal oxidation on which Al wiring is provided. Such a substrate 11 is positioned in the CVD cell 12 into which vapor of $Mo(CO)_6$ carried by Ar gas is introduced through the inlet 12A from the gas supply source 29. The laser beam radiated from the Ar-ion laser means 17 is reflected by the dichroic mirror 20 and is focussed by the lens 16 to pass through the window 13 so that the substrate 11 is locally subject to the radiation of the laser beam 23, thereby resulting in the deposition of Mo thereon in accordance with a local heating thereof. In the circumstance, a direct writing of Mo is performed to form a line on the substrate 11 when the substrate 11 is moved in a direction of the line in accordance with the drive of the X-Y stage 14. A written portion of the substrate 11 is directly observed through the dichroic mirror 20 by means of the camera 21 and television 22. In observing the written portion of Mo thereon, the frequency and intensity modulations are performed respectively by the pulse modulator 18 and intensity modulator 19, while the scanning speed of the laser beam 23 is controlled by the controller 15.

As mentioned before, the substrate 11 comprises the $SiO_2$ film having a small thermal conductivity and Al wiring having a large thermal conductivity both provided on the surface thereof. As a matter of fact, the thermal conductivity of aluminum is 150 times that of $SiO_2$. Therefore, if the laser beam 23 scans the Al wiring in the same scanning speed and intensity of light as those of a laser beam by which the $SiO_2$ film is scanned, a predetermined amount of heat which is required for performing a CVD of Mo on the Al wiring is dissipated through the Al wiring due to the high thermal conductivity thereof so that a direct writing of Mo is difficult to be performed on the Al wiring or in the vicinity thereof. As a result, an electric contact between the Al wiring and a written line of Mo can not be obtained, and a direct writing of Mo can not be performed to cross over the Al wiring.

In the operation 1 in the first embodiment, a power of the laser beam 23 is increased on the Al wiring by a predetermined amount larger than that on the $SiO_2$ under the control of the intensity modulator 19, while the scanning speed of the laser beam 23 is maintained to be constant. To be more concrete, in a case where the scanning speed of the laser beam 23 is fixed to be 4 $\mu m/s$, a power of the laser beam 23 is controlled to be approximately 300 mW to write a line of Mo having a width of approximately 7 $\mu m$ and thickness of approximately 150 nm on the $SiO_2$, film, while a power of the laser beam 23 is increased to be approximately 700 mW to write a line of Mo having a width of approximately 7 $\mu m$ and thickness of approximately 120 nm on the Al wiring. As a result, a stable electric contact can be obtained between a written line of Mo and Al wiring.

Operation 2 (pulse modulation)

The same substrate 11 as in the operation 1 is utilized in the operation 2. A scanning speed of the laser beam 23 is fixed to be 4 $\mu m/s$, and a power of the laser beam 23 is controlled to be 700 mW when the pulse modulation of the laser beam 23 is not performed, and not to be changed before and after a pulse modulation. Under the condition described here, a pulse modulation in which a pulse width of the laser beam 23 is 5 $\mu S$, and a repetition frequency thereof is 10 KHz is performed so that a line of Mo having a width of approximately 6 $\mu m$ and thickness of 250 nm is written on the $SiO_2$ film, while a pulse modulation in which a repetition frequency of the laser beam 23 is increased up to 100 KHz under the control of the pulse modulator 18 is performed to increase a mean value of the intensity of the laser beam 23 so that a line of Mo having a width of approximately 6 $\mu m$ and thickness of approximately 200 nm is written on the Al wiring.

Alternatively, a pulse modulation in which a pulse width of the laser beam 23 is increased up to 50 $\mu S$ without varying the repetition frequency thereof is performed to increase a mean value of the intensity of the laser beam 23 is performed so that a line of Mo having a width of approximately 6 $\mu m$ and thickness of approximately 200 nm is written on the Al wiring.

Operation 3 (control of scanning speed)

The same substrate 11 as in the operations 1 and 2 is utilized in the operation 3. When a power of the laser beam 23 is fixed to be 300 mW, a scanning speed of the laser beam 23 is controlled to be 4 $\mu m/S$ on the $SiO_2$ film so that a line of Mo having a width of approximately 7 $\mu m$ and thickness of approximately 150 nm is written thereon, while a scanning speed of the laser beam 23 is lowered to be 1 $\mu m/S$ on the Al wiring in accordance with the drive of the X-Y stage 14 under the control of the controller 15 so that a line of Mo having a width of approximately 7 $\mu m$ and thickness of approximately 120 nm is written directly thereon.

Operation 4 (pulse modulation)

The operation 4 is different from the operation 2 in that a pulse width of the laser beam 23 and repetition frequency thereof are simultaneously controlled to provide a constant mean value of the intensity of the laser beam 23 in the operation 4, while the former and latter are separately controlled in the operation 2.

In the operation 4, a ceramic substrate 11 which is covered with a polyimide film on which Au wiring is patterned is utilized. In other words, it is said that the substrate 11 comprises the polyimide film having a small thermal conductivity and the Au wiring having a large thermal conductivity. The thermal conductivity of Au is 2000 times that of polyimide and one and half times that of aluminum. When a mean value of the intensity of the laser beam 23 is fixed to be 50 mW after a pulse modulation thereof is performed, and a scanning speed of the laser beam 23 is also fixed to be 4 $\mu$m/S, a repetition frequency thereof is controlled to be 10 KHz on the polyimide film so that a line of Mo having a width of approximately 10 $\mu$m and thickness of approximately 500 nm is written directly thereon, while a repetition frequency of the laser beam 23 is increased to be 200 KHz on the Au wiring to provide a higher peak intensity of the laser beam 23, and a pulse width thereof is narrowed, although a mean value of the intensity of the laser beam 23 is maintained to be constant so that a line of Mo having a width of approximately 10 $\mu$m is written directly thereon.

Throughout the operations 1 to 4 in the first embodiment according to the invention, the Ar-ion laser means 17 is used to radiate a CW (Continuous Wave) laser beam. However, another means radiating a pulse beam may be added to the Ar-ion laser means 17 as described in a following second embodiment according to the invention.

Figure 4:
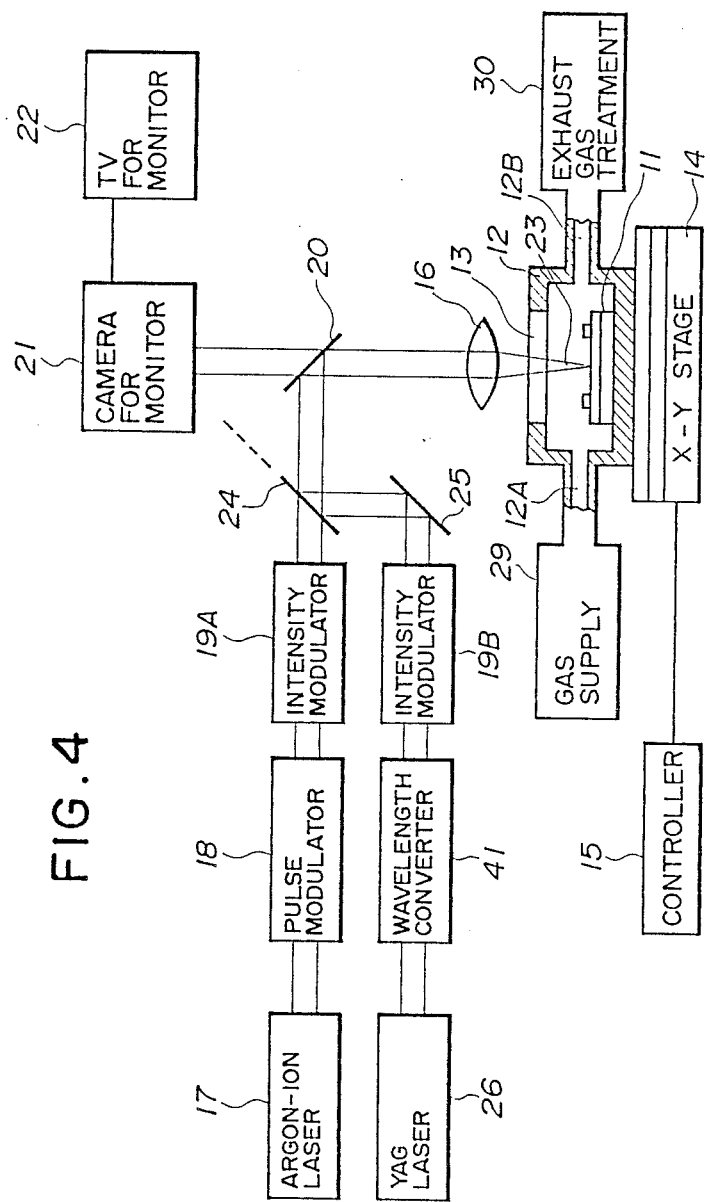
FIG. 4 is a block diagram showing an apparatus for writing a line on a patterned substrate in a second embodiment according to the invention.

In FIG. 4, there is shown an apparatus for writing a line on a patterned substrate in the second embodiment according to the invention wherein like parts are indicated by like reference numerals in FIG. 3 so that repeated explanations are omitted here, provided that the apparatus for writing a line on a patterned substrate further comprises a movable mirror 24 which can be shifted to be positioned on a light path of the laser beam from the Ar-ion laser means 17, a mirror 25 for reflecting light in a predetermined direction, a YAG laser means 26 or radiating a pulse laser beam, a wavelength converter 41 for converting a wavelength of the pulse laser beam from the YAG laser means 26, and an intensity modulator 19B for intensity-modulating the pulse laser beam supplied from the wavelength converter 41. The intensity modulator which is positioned at the next stage of the pulse modulator 18 is changed to be indicated by a reference numeral "19A" in place of "19" in FIG. 3.

In operation, the movable mirror 24 is shifted from a dotted line to a solid line to be positioned on the light path of the laser beam from the Ar-ion laser means 17. The YAG laser means is controlled to radiate a pulse laser beam having a repetition frequency of 1 KHz, a pulse width of approximately 20 ns, and a radiation intensity of 1 MW at the peak thereof. Before the movable mirror 24 is shifted to be positioned on the light path of the laser beam from the Ar-ion laser means 17, a line of Mo is written directly on the SiO$_2$ film of the substrate 11 in accordance with the radiation of the laser beam 23 from the Ar-ion laser means 17. Next, the movable mirror 24 is shifted as described before so that the pulse laser beam is introduced through the mirror 25 and movable mirror 24, and further the dichroic mirror 20 to the CVD cell 12 to be as the pulse laser beam 23.

The laser beam 23 is of a large power at the peak thereof and a narrow pulse width as described before so that Al wiring having, for instance, a width of 10 $\mu$m can be subject to the radiation of the pulse laser beam 23 transiently, thereby being heated locally up to a predetermined temperature. As a result, a good quality of Mo CVD is performed on the Al wiring so that a contact between the line of Mo formed on the SiO$_2$ film beforehand and the Al wiring can be formed with a good characteristic, for instance, of a contact resistance value of approximately 200$\Omega$.

Figure 5A:
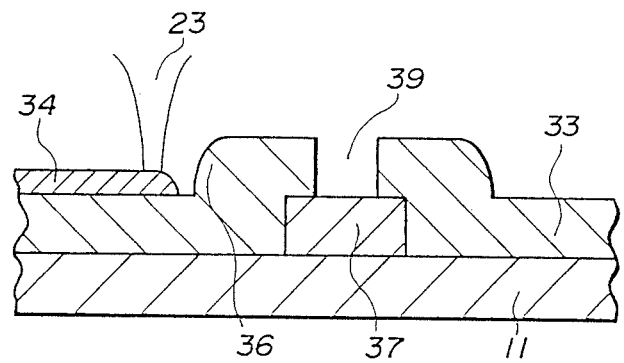
FIGS. 5A to 5C are cross sectional views showing sequential stages at which a line is written on a patterned substrate in the second embodiment according to the invention.
Figure 5B:
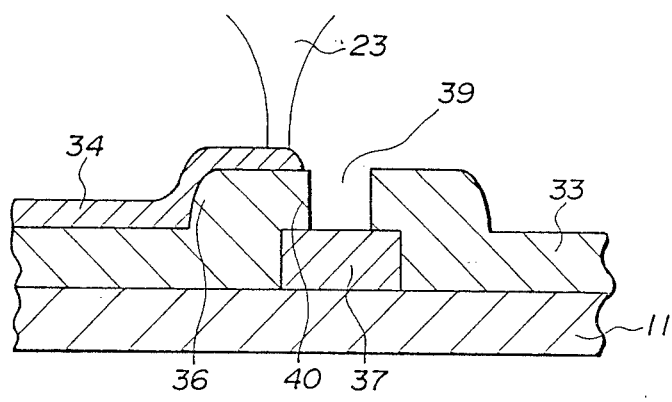
Figure 5C:
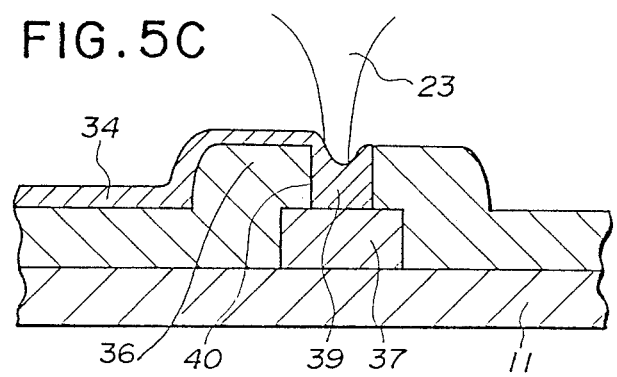

In another operation, a via hole provided into a PSG insulator film on a substrate is buried with a CVD of Mo to connect a line of Mo on the PSG insulator film to Al wiring. At first, the Ar-ion laser means 17 is driven to radiate Ar-ion laser beam having no pulse modulation, but an intensity of approximately 0.3 MW/cm$^2$. In the circumstance, a scanning speed of the laser beam 23 is controlled to be 10 $\mu$m/S so that a line 34 of Mo is written directly on a PSG insulator film 33 having a step portion 36 and via hole 39 as shown in FIG. 5A wherein a substrate 11 which is covered with the PSG insulator film 33 on which Al wiring 37 is provided. Next, when the laser beam 23 approaches the via hole 39 as shown in FIG. 5B, the laser beam from the Ar-ion laser means 17 is interrupted by the movable mirror 24 to be shifted to a solid line, while the pulse laser beam from the YAG laser means 26 is converted in regard to wavelength in the wavelength converter 41 to have a second harmonic light of 532 nm which is introduced to the CVD cell 12. The pulse laser beam 23 thus introduced is of a pulse width of 20 ns and a peak intensity 1.1 MW/cm$^2$. By use of such a pulse laser beam, a direct writing of Mo can be performed even in the vicinity of the via hole 39 in which heat is dissipated due to a large thermal conductivity of the Al wiring 37, although a temperature at which a CVD of Mo is performed is not obtained in a conventional manner. Further, when the laser beam 23 reaches the via hole 39 as shown in FIG. 5C, the via hole 39 is continued to be subject to the radiation of the pulse laser beam 23 for approximately 60 seconds so that the via hole 39 is completely burried with Mo, thereby providing a good quality of a contact at the bottom thereof. A resistance value of the contact thus formed is approximately 30$\Omega$ which is a satisfactory value applicable to a wiring of MOS LSI.

Figure 6:
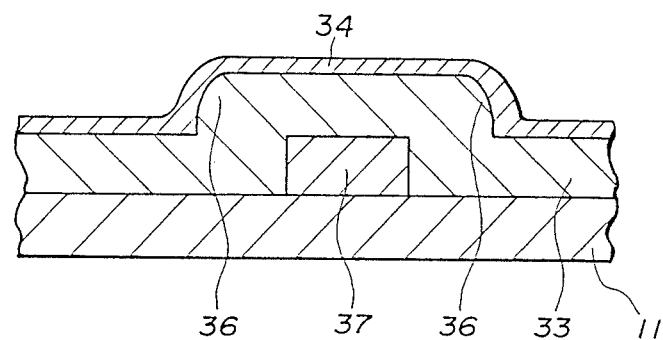
FIG. 6 is a cross sectional view showing a patterned substrate on which a line is written in the second embodiment according to the invention.

The same operation as described above is applicable to an insulator film 33 having a step portion 36 to write a line 34 of Mo directly thereon as shown in FIG. 6 so that no disconnection of the line 34 is occured.

In FIG. 7, there is shown an apparatus for writing a line on a patterned substrate in a third embodiment according to the invention. The apparatus for writing a line on a patterned apparatus is different mainly from one in the first embodiment according to the invention in that a beam shape converter 27 provided on a rotary stage 28 is added thereto, while the pulse modulator 18 and intensity modulator 19 are excluded therefrom. In the present embodiment, a substrate 11 of Si LSI which is provided with poly-Si wiring layer on which SiN insulator layer is formed is positioned in the CVD cell 12. Circular Gaussian beam radiated from the Ar-ion laser beam 17 is converted in the beam shape converter 27 into an elliptical elongated Gaussian beam which is then reflected by the mirror 25. The elliptical laser beam thus reflected is focussed through the window 13 on the substrate 11 by the lens 16. The beam shape converter 27 includes two pieces of cylindrical lenses 27a and 27b to have a construction of a beam expander such that a vertical beam diameter is enlarged 5 times an original beam diameter, while a horizontal beam diameter remains unchanged. CVD raw material gas of Mo(CO)$_6$ which is diluted with Ar gas is supplied from the gas supply source 29 to the CVD cell 12. The partial pressure of Mo(CO)$_6$ is 1 Torr, and the total pressure of the gas is 1 atmospheric pressure. After the reaction of the gas in the CVD cell 12, the exhausted gas is treated in the exhaust gas treatment unit 30 to provide no pollution. The X-Y stage 14 is controlled to provide a predetermined scanning speed of the laser beam 23 and a predetermined scanning direction of the laser beam 23 so that a direction, pattern etc. of a written line are defined. On the other hand, the rotary stage 28 rotates the beam shape converter 27 on the light axis of the laser beam so that the line of apsides of the focussed elliptical laser beam aligns in regard to a scanning direction of the S-Y stage 14.

In operation, a substrate 11 is processed to. have a via hole provided into SiN insulator film on poly-Si layer, and is positioned on a predetermined place in the CVD cell 12. Next, the X-Y stage 14 is driven to move the substrate 11 in a predetermined direction so that the laser beam 23 is focussed on the via hole of the substrate 11. As a matter of course, the line of apsides of the focussed elliptical laser beam 23 aligns in regard to the scanning direction of the X-Y stage 14. At this moment, raw material gas is supplied from the gas supply source 29 to the CVD cell 12. After such a preparatory stage, the laser beam is radiated from the Ar-ion laser means 17, while the X-Y stage 14 is controlled to be moved, thereby providing a predetermined scanning speed of the laser beam 23. Thus, a CVD line of Mo is written directly on the SiN insulator layer to connect the poly-Si wirings.

A comparison between the operations in which an elliptical and circular laser beams are utilized is explained as follows.

It is assumed that a spot size of the circular laser beam is 2 μm in its diameter, while a spot size of the elliptical laser beam is 10 μm in its line of apsides and 2 μm in its minor axis. Further, a minimum step moving distance of the X-Y stage 14 is assumed to be 1 μm.

In the use of the circular laser beam, a good quality of wiring having a width of 5 μm and thickness of 0.5 μm, and a resistivity of 30 μΩcm is obtained under the condition that a scanning speed is 6 μm/S, and the amount of a radiation light is 500 mW. When the scanning speed is increased without varying the radiation intensity, the thickness of the wiring is decreased, and a disconnection of the wiring is occured at a step portion of the substrate. When the scanning speed is increased up to 10 μm/S, and a power of the laser beam is increased up to 700 mW, a width of a line is expanded up to 7 μm, and is varied in the longitudinal direction. Even worse, some concave portions which are considered to be damaged are found on the wiring. As a conclusion, a scanning speed at which a good quality of wiring is written by use of a circular beam is approximately 6 μm/S.

In the use of the elliptical laser beam, on the other hand, a good quality of wiring having the same thickness and width as in the circular laser beam, and having a low resistivity is formed at a scanning speed of 30 μm/S. At this time, a power of the radiation laser beam is 2W, and a good quality of Wiring can be obtained even by changing the power from 1.5W to 2.5 W. Further, a frequency of resulting in a disconnection of wiring at a step portion of an insulator film is remarkably decreased as compared to the use of the circular laser beam. Even more, a disconnection of wiring is not found at a step portion of an insulator film as high as approximately 1.5 μm.

In the third embodiment described above, a cylindrical lens may be used as the beam shape converter 27 to convert the circular laser beam into an elliptical one, although a beam expander is used therein. In such a case, an adjustment of an optical system becomes a little complicated because a spreading angle of the laser beam is changed together with the conversion of the laser beam shape. Further, a beam splitter may be used as the beam shape converter 27 to convert an incident laser beam into a plurality of parallel lined beams so that an elongated shape of lined spots are defined on the substrate. Still further, although Mo(CO)$_6$ is used as a raw material gas, W(CO)$_4$ or WF$_6$ may be used to write a line of W deposition, and SiH$_4$ or SiH$_4$Cl$_2$ may be used to write a line of Si deposition.

In FIG. 4, there is shown an apparatus for writing a line on a patterned substrate in the fourth embodiment according to the invention. The apparatus for writing a line on a patterned substrate is similar to one in the third embodiment, but is different therefrom in that the beam shape converter 27 is not provided with a rotary stage, the X-Y stage is replaced by an X stage 32, and the X stage 32 is provided on a rotary stage 31. In the apparatus for writing a line on a patterned substrate, an operation in which the line of apsides of an elliptical laser beam aligns in regard to the scanning direction of the laser beam is performed by the rotary stage 31. As a result, a moving unit is eliminated from an optical system for laser beam radiation so that a wiring position on a substrate is prevented from being deviated out of a specified position due to the movement of a light axis. Further, the construction of the apparatus becomes simplified, and the cost thereof is lowered because the line of apsides of an elongated laser beam aligns in regard to the scanning direction by means of the rotary stage 31, and the scanning direction is also set in the direction of wiring by means of the rotary stage 31.

As clearly understood from the first to fourth embodiments according to the invention, the principle and operation of the invention will be explained as follows.

When such a continuous wave laser beam as Ar-ion laser beam scans a substrate having patterned multilayers thereon from a region of a low thermal conductivity to a region of a high thermal conductivity without performing any of an intensity modulation of the laser beam and pulse modulation thereof, and changing even a scanning speed, a width of a CVD line is narrowed on the region of the high thermal conductivity, and a quality thereof is deteriorated thereon because the heat which is dissipated is increased so that a temperature which is required for CVD process is difficult to be reached on that region. For the purpose of writing an uniform width and good quality of a line directly on a substrate, the decrease of a temperature must be avoided in the region having a high thermal conductivity by adopting at lease one of an intensity modulation of the laser beam and pulse modulation thereof, and the control of a scanning speed of the laser beam so that a limitation in which a CVD process is not performed dependent upon a thermal conductivity of a region is eliminated.

At first, an operation in which an intensity modulation of a continuous wave laser beam is performed without performing a pulse modulation thereof, and a scanning speed of the laser beam is fixed to be constant is explained. That is, when a laser beam begins to scan a region of a high thermal conductivity after that of a low thermal conductivity, an intensity of the laser beam is increased so that the dissipation of heat is compensated to provide the same area of a temperature as on a region of a low thermal conductivity where a CVD process can be performed. As a result, an uniform width and good quality of a CVD line can be written over regions having different thermal conductivities.

Secondly, an operation in which a pulse modulation of a continuous wave laser beam is performed, and an intensity thereof and a scanning speed thereof are fixed to be constant is explained. That is, when a peak intensity of a pulse which is obtained from a continuous wave laser beam is fixed to be constant in a case where a repetition frequency of the pulse is changed, a mean value of the intensity of the laser beam becomes larger as a repetition frequency thereof is increased and a pulse width thereof becomes wider. Accordingly, when a pulse laser beam begins to scan a region of a high thermal conductivity after that of a low thermal conductivity, a repetition frequency thereof is increased, or a pulse width thereof is widen so that the dissipation of heat is compensated on the region of the high thermal conductivity. As a result, a temperature which is required for a CVD process is reached thereon so that an uniform width and good quality of a line can be written over regions of different thermal conductivities.

Thirdly, an operation in which a scanning speed of a continuous wave laser beam is controlled without performing both an intensity modulation thereof and pulse modulation thereof is explained. That is, when a scanning speed of the laser beam is lowered, a time during which a substrate is heated per an unit area by the laser beam is increased. Accordingly, when a continuous wave laser beam to scan a region of a high thermal conductivity after that of a low thermal conductivity, a scanning speed of the continuous wave laser beam is lowered to increase a heating time per an unit area so that the dissipation of heat is compensated on that region. As a result, an uniform width and good quality of a CVD line can be written over regions of different thermal conductivities.

Although one of an intensity modulation and pulse modulation of a continuous wave laser beam, and be performed simultaneously.

A following explanation is a case where an intensity modulation of a continuous wave laser beam and pulse modulation thereof are combined to write a CVD line directly on a substrate. In more detail, a pulse of the continuous wave laser beam is controlled in regard to an intensity and pulse width such that a mean value of the intensity of the pulse, and the product of a pulse width and repetition frequency thereof are constant respectively. In such a case, a peak intensity of the pulse is increased, and the pulse width is shortened in its time, as the repetition frequency is increased. Accordingly, when a chopping frequency of the pulse is high, the peak intensity thereof is large, and the pulse width thereof is narrow so that a region of a substrate is repeatedly heated by a specified short period before a temperature up to which the region is heated is substantially lowered. As a result, an area of a region in which a CVD process can be performed is narrower than that of a region in which a pulse modulation of a continuous wave laser beam is not adopted.

In a case where the difference of thermal conductivities of two regions is relatively large, when a continuous wave laser beam begins to scan a region of a high thermal conductivity after that of a low thermal conductivity, only a small spot is increased in the region up to a predetermined temperature by which a CVD process can be performed because the heat is dissipated therein due to the high thermal conductivity. Therefore, when an intensity of a continuous wave laser beam is increased, or a scanning speed thereof is lowered so that the temperature is increased in the region up to a predetermined temperature by which a CVD process can be performed, it is happened that an area of the region in which the temperature is more than the predetermined temperature is larger than an area in a region of a lower thermal conductivity in which a CVD process can be performed. For the reason, in a case where different kinds of materials having a large difference of thermal conductivities are adjacent to each other, a width of a line is liable to be larger in the region having a large thermal conductivity than in the region having a small thermal conductivity. In this respect, both an intensity modulation of a continuous wave and pulse modulation thereof are utilized so that an area which is heated up to a predetermined temperature to be required for a CVD process is narrower, as a chopping frequency thereof is increased as mentioned before. As a result, an uniform width and good quality of a CVD line can be written directly on a substrate by maintaining a mean value of the laser beam intensity to be unchanged, and by increasing a repetition frequency of the pulse modulation, when the laser beam begins to scan the region of the high thermal conductivity after that of the low thermal conductivity.

Although the modulations of a continuous wave laser beam is explained above, a pulse laser beam may be used in place of the continuous wave laser beam so that a pulse width of the pulse laser beam can be shorter than that of a pulse modulation of the continuous wave laser beam, thereby allowing a more local and transient heating to be performed. Accordingly, a good quality of a line can be written even in a region having a large thermal conductivity. Further, much better quality of a line can be written in accordance with the increase of the heating effect when a pulse width of the pulse laser beam is shortened so that a portion which is subject to the laser beam radiation is heated only in a limited surface layer. The pulse laser beam may be not only an oscillation light of a pulse oscillation laser means, but also a light generated in a non-linear optical element like, for instance, a second harmonic wave in Q-switched YAG laser means.

Next, an operation in which a circular laser beam is converted into an elliptical laser beam, the line of apsides of which is parallel or orthogonal to the scanning direction of the laser beam, is explained.

When the line of apsides of the elliptical laser beam is parallel to the scanning direction of the laser beam, the radiation time of the laser beam is longer by a ratio of the line of apsides in regard to the minor axis thereof as compared to a case where a circular laser beam is utilized. As a result, a scanning speed of such an elongated laser beam as the elliptical laser beam can be faster by that ratio than a scanning speed of a circular laser beam in a case where intensities of the radiation laser beam are controlled to be the same level between the elongated and circular laser beams. For the reason, it becomes possible that a higher speed formation of wirings is performed without affecting the characteristics of a width, thickness and quality of a line. Further, when a line is written directly on a step portion of a substrate, the line of apsides of the elliptical line is controlled to be much longer than a minimum step moving distance of an X-Y stage without changing the minor axis thereof so that the laser beams are overlapped sufficiently in the scanning direction, thereby providing a stable line having no disconnection and thinner portion at the step portion of the substrate.

On the contrary, when the line of apsides of the elliptical laser beam is orthogonal to the scanning direction of the laser beam, a wider line can be written so that a wiring pad having a large area can be formed in a short time.

Although the invention has been described with respect to specific embodiment for complete and clear disclosure, the appended claims are not to thus limited but are to be construed as embodying all modification and alternative constructions that may occur to one skilled in the art which fairly fall within the basic teaching herein set forth.

What is claimed is:

1. An apparatus for writing a line on a patterned substrate comprising, a laser beam source for radiating a laser beam,
    a CVD cell in which a substrate is positioned, said CVD cell having a window for passing said laser beam, said substrate having at least two kinds of patterned films thereon, each being of a thermal conductivity different from others,
    an optical focusing means for focusing said laser beam to form a beam spot on the surface of said substrate,
    a gas supply means for supplying a CVD raw material gas into said CVD cell,
    an optical power control means selected from a pulse modulator, and intensity modulator, a wavelength converter, a beam shape converter, and a scanning speed controller, said optical power control means controlling optical power consumed in a laser beam spot-radiating area of said substrate dependent on the thermal conductivity of said laser beam spot-radiating area, thereby increasing the temperature of said laser beam spot-radiating area to a predetermined temperature regardless of the difference of said thermal conductivity, and
    a stage means on which said CVD cell is provided to be moved in the scanning direction so that said substrate in said CVD cell is scanned by said beam spot.

2. An apparatus for writing a line on a patterned substrate according to claim 1,
    wherein said laser beam source includes a pulse laser beam source and a continuous wave laser beam source, said pulse laser beam source being selected to write a line on a via hole of said substrate, said continuous wave laser beam source being selected to write a line on a insulation film of said substrate 3. An apparatus for writing a line on a patterned substrate according to claim 1,
    wherein said stage means is provided on a rotary stage whereby said stage means is rotated.

4. An apparatus for writing a line on patterned substrate according to claim 2,
    wherein said beam shape converter is provided above a rotary stage whereby said beam shape converter is rotated, said rotary stage being able to be separated from said beam shape converter.

5. An apparatus for writing a line on a patterned substrate according to claim 1, wherein said beam shape converter is rotated, said rotary stage being able to be separated from sid beam shape converter.

* * * * *

UNITED STATES PATENT AND TRADEMARK OFFICE
CERTIFICATE OF CORRECTION

PATENT NO. : 4,873,413
DATED : October 10, 1989
INVENTOR(S) : Fumihiko UESUGI

It is certified that error appears in the above-identified patent and that said Letters Patent is hereby corrected as shown below:

Column 7, line 44, delete "or" and insert --for--;

Column 11, line 47, after "beam, and" insert --the control of a scanning speed therof is selected independently to be performed, two or all of them may--;

Column 14, line 36, delete "sid" and insert --said--

Signed and Sealed this

Twenty-third Day of October, 1990

Attest:

HARRY F. MANBECK, JR.

*Attesting Officer*  *Commissioner of Patents and Trademarks*